United States Patent
Yin et al.

(10) Patent No.: US 8,327,861 B2
(45) Date of Patent: Dec. 11, 2012

(54) MEGASONIC PRECISION CLEANING OF SEMICONDUCTOR PROCESS EQUIPMENT COMPONENTS AND PARTS

(75) Inventors: Yaobo Yin, Pleasanton, CA (US); Linda (Tong) Jiang, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 1027 days.

(21) Appl. No.: 11/642,333

(22) Filed: Dec. 19, 2006

(65) Prior Publication Data

US 2008/0142055 A1 Jun. 19, 2008

(51) Int. Cl.
*B08B 3/12* (2006.01)
*B08B 3/02* (2006.01)
*B08B 3/04* (2006.01)
*B08B 3/08* (2006.01)

(52) U.S. Cl. ...... 134/95.1; 134/94.1; 134/105; 134/111; 134/184; 134/902

(58) Field of Classification Search ............ 134/95.1, 134/105, 111, 184, 186, 198, 902, 94.1
See application file for complete search history.

(56) References Cited

U.S. PATENT DOCUMENTS

| | | | |
|---|---|---|---|
| 3,007,478 A | 11/1961 | Leonhardt et al. | |
| 3,445,092 A | 5/1969 | Melville, Jr. et al. | |
| 3,717,539 A | 2/1973 | Roberts | |
| 4,118,649 A | 10/1978 | Shwartzman et al. | |
| 4,221,964 A | 9/1980 | Schlereth et al. | |
| 4,317,223 A | 2/1982 | Farmer | |
| 4,326,553 A | 4/1982 | Hall | |
| 4,572,753 A | 2/1986 | Bach | |
| 4,607,323 A | 8/1986 | Sokal et al. | |
| 4,804,007 A * | 2/1989 | Bran | 134/184 |
| 4,820,377 A | 4/1989 | Davis et al. | |
| 4,869,278 A | 9/1989 | Bran | |
| 4,870,982 A | 10/1989 | Liu | |
| 5,071,776 A | 12/1991 | Matsushita et al. | |
| 5,143,103 A | 9/1992 | Basso et al. | |
| 5,211,625 A | 5/1993 | Sakurai et al. | |
| 5,286,657 A | 2/1994 | Bran | |
| 5,292,373 A * | 3/1994 | Arita et al. | 134/2 |
| 5,349,166 A | 9/1994 | Taylor | |
| 5,365,960 A | 11/1994 | Bran | |
| 5,368,054 A | 11/1994 | Koretsky et al. | |
| 5,377,709 A | 1/1995 | Shibano | |

(Continued)

FOREIGN PATENT DOCUMENTS

CN 1444256 A 9/2003

(Continued)

OTHER PUBLICATIONS

Sokal, Class E—A New Class of High-Efficiency Tuned Single-Ended Switching Power Amplifiers, Jun. 1975, IEEE Journal of Solid-State Circuits.

*Primary Examiner* — Michael Barr
*Assistant Examiner* — Benjamin Osterhout
(74) *Attorney, Agent, or Firm* — Martine Penilla Group, LLP

(57) ABSTRACT

Methods and apparatus are provided for using various megasonic apparatus including megasonic tanks, scanning megasonic plates, megasonic jets, and megasonic sweeping beams etc., in combination with selective chemistries to remove sub-micron particulate contaminants from the surfaces of the processing equipment used in semiconductor, medical, or any other processing environments.

15 Claims, 7 Drawing Sheets

U.S. PATENT DOCUMENTS

| | | | |
|---|---|---|---|
| 5,379,785 A | 1/1995 | Ohmori et al. | |
| 5,383,484 A | 1/1995 | Thomas et al. | 134/184 |
| 5,421,923 A | 6/1995 | Clarke et al. | |
| 5,447,171 A | 9/1995 | Shibano | |
| 5,523,058 A | 6/1996 | Umemura et al. | |
| 5,543,604 A | 8/1996 | Taylor | |
| 5,556,479 A | 9/1996 | Bran | |
| 5,562,778 A | 10/1996 | Koretsky et al. | |
| 5,601,655 A | 2/1997 | Bok et al. | |
| 5,750,971 A | 5/1998 | Taylor | |
| 5,762,084 A | 6/1998 | Krusell et al. | |
| 5,849,091 A | 12/1998 | Skrovan et al. | |
| 5,868,866 A | 2/1999 | Mackawa et al. | |
| 5,909,741 A | 6/1999 | Ferrell | |
| 5,931,173 A | 8/1999 | Schiele | |
| 5,980,647 A | 11/1999 | Buker et al. | |
| 5,996,601 A | 12/1999 | Kern et al. | |
| 6,016,023 A | 1/2000 | Nilsson et al. | |
| 6,016,821 A | 1/2000 | Puskas | |
| 6,017,398 A * | 1/2000 | Scotto et al. | 134/1 |
| 6,019,757 A | 2/2000 | Scheldrup | |
| 6,090,106 A | 7/2000 | Goble et al. | |
| 6,119,367 A | 9/2000 | Kamikawa et al. | |
| 6,127,281 A | 10/2000 | Sakaguchi et al. | |
| 6,140,744 A | 10/2000 | Bran | |
| 6,202,658 B1 | 3/2001 | Fishkin et al. | |
| 6,220,259 B1 | 4/2001 | Brown et al. | |
| 6,222,305 B1 | 4/2001 | Beck et al. | |
| 6,269,511 B1 | 8/2001 | Andreas et al. | |
| 6,270,584 B1 | 8/2001 | Ferrell et al. | |
| 6,276,370 B1 | 8/2001 | Fisch et al. | |
| 6,295,999 B1 | 10/2001 | Bran | |
| 6,311,702 B1 | 11/2001 | Fishkin | |
| 6,318,248 B1 | 11/2001 | Capodieci | |
| 6,333,268 B1 | 12/2001 | Starov et al. | |
| 6,380,099 B2 | 4/2002 | Sakaguchi et al. | |
| 6,385,805 B2 | 5/2002 | Konishi et al. | |
| 6,460,551 B1 | 10/2002 | Fishkin et al. | |
| 6,468,362 B1 | 10/2002 | Chen et al. | |
| 6,539,952 B2 | 4/2003 | Itzkowitz | |
| 6,622,312 B2 | 9/2003 | Rabinowicz | |
| 6,644,327 B1 | 11/2003 | Mitsumori et al. | |
| 6,729,339 B1 | 5/2004 | Boyd et al. | |
| 6,796,315 B2 | 9/2004 | Lu et al. | |
| 6,840,250 B2 | 1/2005 | Kashkoush et al. | |
| 6,845,778 B2 | 1/2005 | Boyd et al. | |
| 6,866,051 B1 | 3/2005 | Nickhou et al. | |
| 6,928,751 B2 | 8/2005 | Hosack et al. | |
| 6,995,067 B2 | 2/2006 | Boyd et al. | |
| 7,040,330 B2 | 5/2006 | Boyd et al. | |
| 7,040,332 B2 | 5/2006 | Boyd et al. | |
| 7,165,563 B1 | 1/2007 | Boyd et al. | |
| 2001/0013355 A1 | 8/2001 | Busnaina | |
| 2001/0047810 A1 | 12/2001 | Farber et al. | 134/1.3 |
| 2002/0139389 A1 | 10/2002 | Treur | |
| 2003/0062071 A1 | 4/2003 | Sorbo et al. | |
| 2003/0116175 A1 * | 6/2003 | Sasaki | 134/1.3 |
| 2003/0168078 A1 | 9/2003 | Deguchi | 134/1.3 |
| 2004/0016442 A1 | 1/2004 | Cawfield | |
| 2004/0069319 A1 | 4/2004 | Boyd et al. | |
| 2004/0089324 A1 | 5/2004 | Gray et al. | |
| 2004/0097389 A1 | 5/2004 | Yeo et al. | 510/175 |
| 2004/0163682 A1* | 8/2004 | Boyd et al. | 134/33 |
| 2005/0003737 A1* | 1/2005 | Montierth et al. | 451/5 |
| 2010/0192974 A1 | 8/2010 | Matsumoto et al. | 134/1.3 |

FOREIGN PATENT DOCUMENTS

| | | |
|---|---|---|
| FR | 2762240 | 10/1998 |
| JP | 62281431 | 12/1987 |
| JP | 4-87675 | 3/1992 |
| JP | 8-332465 | 12/1996 |
| JP | 10128256 | 5/1998 |
| JP | 0 856 873 | 8/1998 |
| JP | 2000-183012 | 6/2000 |
| JP | 2001-77070 | 3/2001 |
| KR | 1020060077520 | 7/2006 |
| WO | WO 2006/040993 A1 | 4/2006 |

* cited by examiner

MEGASONIC PRECISION CLEANING OF SEMICONDUCTOR PROCESS EQUIPMENT COMPONENTS AND PARTS

BACKGROUND

1. Field of the Invention

The invention relates generally to the precision cleaning of processing and manufacturing equipment and, more particularly, to apparatus and methods for utilizing high frequency megasonic energy in combination with selective cleaning media to clean electronic device processing and manufacturing equipment, and other types of processing and manufacturing equipment etc.

2. Description of the Related Art

In electronic device manufacturing operations, megasonic cleaning is widely used to remove particle contamination from semiconductor wafers, magnetic media, etc. to mitigate against the detrimental effects of particle contamination on wafer yield and device reliability. However, there are persistent concerns regarding particulate and trace metal cross-contamination between semiconductor wafers, magnetic media and the parts, equipment, or tools, etc. that are used to process these semiconductor wafers, magnetic media.

Conventionally, the cleaning of the processing parts, equipment, and tools etc. used in electronic device manufacturing operations is accomplished using low-frequency (less than 75 KHz) ultrasonic precision cleaning methods. However, as the critical dimensions of semiconductor wafers etc. continue to decrease and the number of submicron particles (e.g. 0.1 µm-0.5 µm) deposited on the surfaces of processing parts, equipment, and tools etc. increase, low-frequency ultrasonic cleaning techniques are no longer capable of effectively removing submicron particles from processing parts, equipment, tools, etc, which can greatly affect wafer fabrication line yield and device yield, etc.

In view of the forgoing, there is a need for an approach for applying megasonic energy to effectively remove submicron particulate contamination from the surfaces of semiconductor processing equipment components, etc.

SUMMARY

In one embodiment, the present invention provides an apparatus for cleaning a processing component. The apparatus comprises a tank having a cavity defined by a based and one or more sidewalls extending therefrom and an opening opposite the base. The tank is configured to hold a volume of fluid within the cavity to immerse the processing component. The apparatus further comprises a plate assembly that is capable of moving over a surface of the processing component and generating high frequency megasonic acoustic energy associated with a direction generally perpendicular to the surface of the processing part.

In another embodiment, the present invention provides an apparatus for cleaning a processing component. The apparatus comprises a processing chamber having a carrier element, where the element is capable of supporting the processing component within the processing chamber. The apparatus further comprises a fluid supply assembly that is capable of supplying a fluid to a surface of the processing component. The apparatus also comprises a beam assembly that is capable of generating a beam of high frequency megasonic acoustic energy, where the beam of acoustic energy is applied to the surface of the processing component.

In yet another embodiment, the present invention provides an apparatus for cleaning a processing component. The apparatus comprises a processing chamber that includes carrier element that is capable of supporting the processing component within the processing chamber. The apparatus further comprises jet assembly that is capable of supplying acoustically energized fluid to a surface of the processing component.

Other aspects and advantages of the invention will become apparent from the following detailed description, taken in conjunction with the embodiments and accompanying drawings, illustrating, by way of example, the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION

Embodiments of the present invention provide systems, apparatus, and methods for applying megasonic energy to effectively remove submicron particulate contamination from electronic device processing parts, components, tools, etc. or any other part, component, tool, etc. that is not a substrate or wafer, but that can be subject to inorganic or organic submicron particulate contamination. Specifically, embodiments of the present invention provide an approach for using high frequency megasonic energy (approximately 600 KHz-2 MHz) and selective cleaning media (e.g. chemicals, fluids, etc.) in conjunction with various precision cleaning apparatus to remove submicron particles from the surfaces and sidewalls of processing parts, components, tools, etc.

The precision cleaning apparatus of embodiments of the present invention can include megasonic tanks, scanning megasonic plates, megasonic jets, and megasonic sweeping beams that can be used to enhance micro-streaming forces (see FIG. 1) created on the surface of the parts, components, tools, etc. being cleaned and to clean parts, components, tools, etc. having varied complex configurations, sizes, and critical components. In embodiments of the present invention, various types of cleaning media can be selectively chosen for enhancing the performance of the megasonic cleaning process, and for compatibility with the chemical and physical etc. properties of the materials from which the parts, components, tools, etc. are made of. Additionally, in embodiments of the present invention, the various types of cleaning media can be selectively applied (e.g. heated, re-circulated, sequenced, etc.) to further optimize the megasonic cleaning process.

In the description herein for embodiments of the present invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention. The present invention includes several aspects and is presented below and discussed in connection with the Figures and embodiments.

Figure 1:
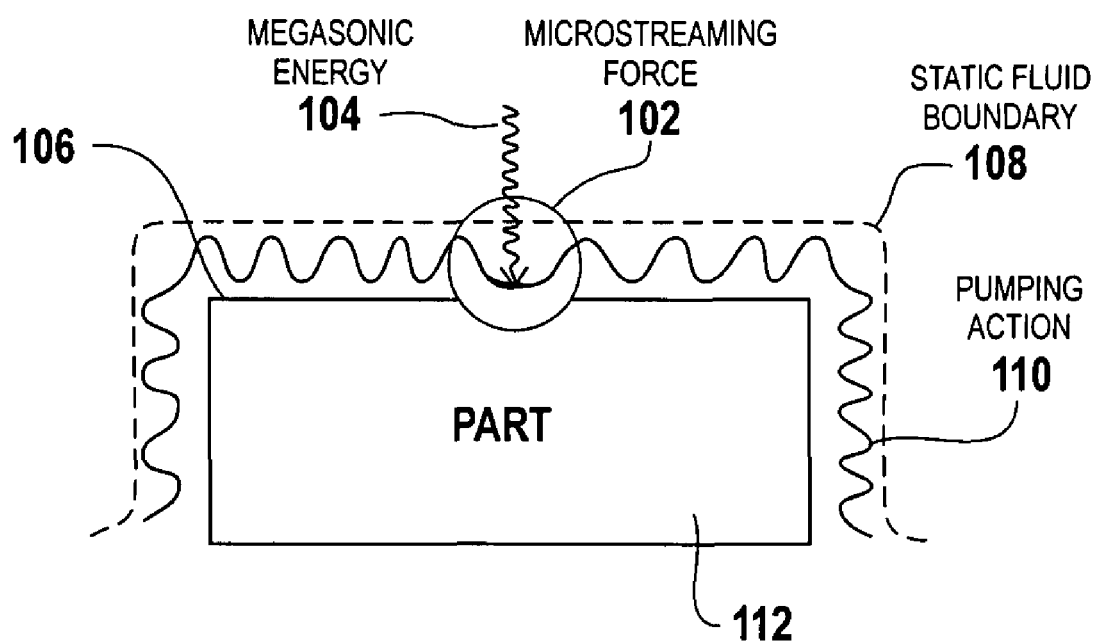
FIG. 1 is a side view illustration of micro-streaming force created within a static fluid boundary surrounding selective surfaces of a processing component resulting from the application of megasonic energy at a surface of the part.

In FIG. 1, the cleaning mechanisms of embodiments of the present invention are associated with cavitation and micro-streaming forces which, when combined with chemical actions or any other action, remove contaminants from the surfaces of processing components, etc. Cavitation is the rapid forming and collapsing of microscopic bubbles generated from dissolved gas when sonic energy is applied to a liquid medium. Upon collapse, the bubbles release energy that assists in particle removal through breaking the adhesion forces that attach submicron particulates to the surface of parts, etc. As shown in FIG. 1, a micro-streaming force 102 is created when megasonic energy 104, applied at a surface 106 of a processing component 112 to be cleaned using piezoelectric megasonic transducers, etc., penetrates a static fluid boundary layer (or meniscus) 108 that surrounds one or more surfaces of the processing component 112. The micro-streaming force 102 generates a pumping action 110 (i.e. a fluid motion induced by acoustic waves propagating through the static fluid boundary layer 108 when power is applied to the piezoelectric transducers etc.) that continuously delivers fresh solution to the surface(s) of the processing component 112 while simultaneously removing contaminants and depleting old chemistry from the surface(s) of the processing component 112.

Figure 2A:
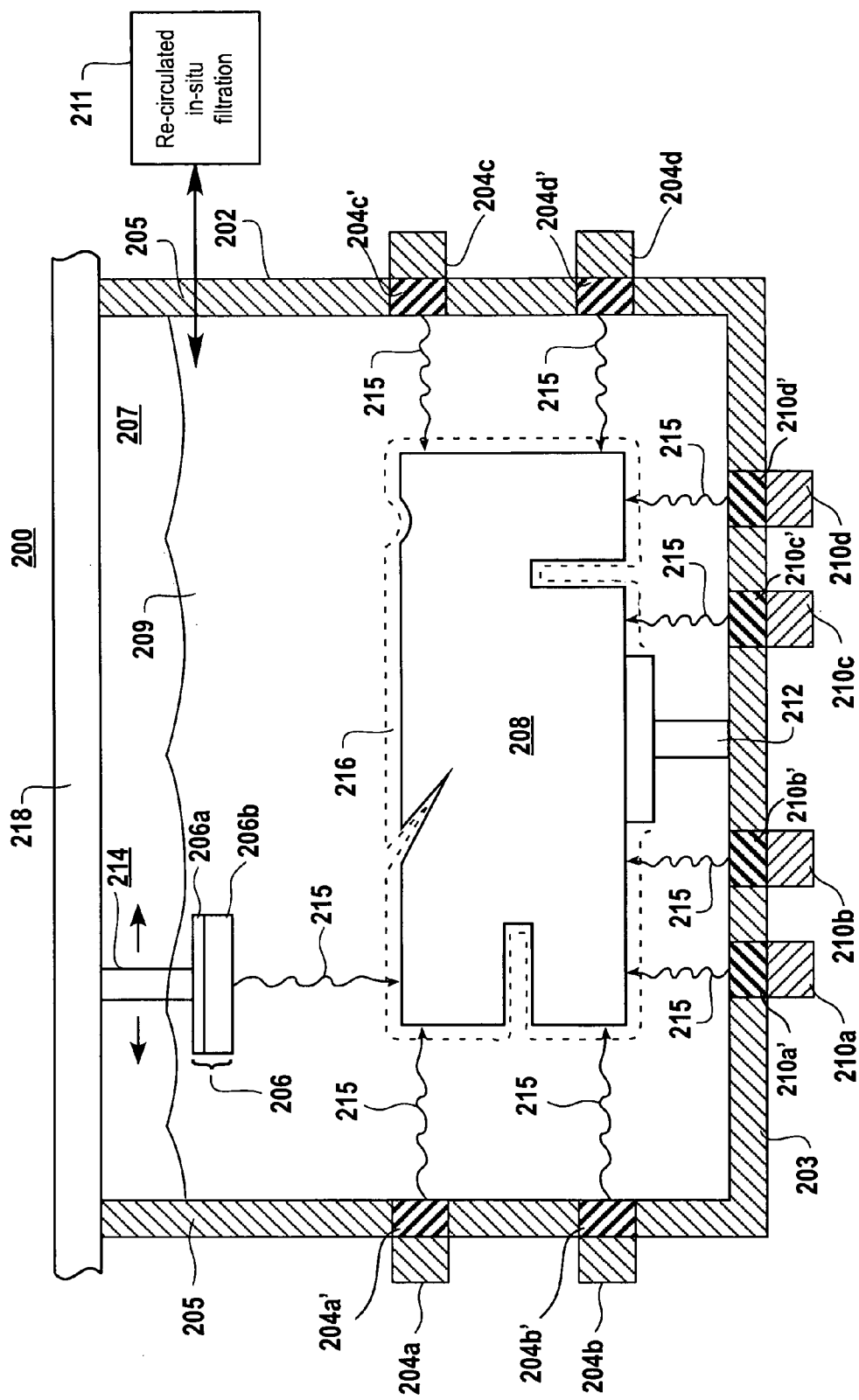
FIG. 2A is a cross-sectional view illustration of a megasonic precision cleaning apparatus including a scanning megasonic plate in accordance with one embodiment of the present invention.

In FIG. 2A, is an illustration of a megasonic precision cleaning apparatus 200, in accordance with one embodiment of the present invention. The apparatus 200 includes a megasonic tank 202 having a base 203, and sidewalls 205 that extend from the base 203 to form a cavity 207. The cavity 207 of the tank 202 contains a cleaning solution or fluid 209 that is selectively chosen for its ability to enhance the megasonic precision cleaning of a processing component 208. The processing component 208 is immersed in the cleaning solution 209 and supported by a carrier 212. However, any suitable means for supporting the processing component 208 in the cleaning solution 209 can be used with embodiments of the present invention. As used herein, cleaning solution and cleaning chemistry are interchangeable. In one embodiment of the present invention, the cleaning solution 209 can include an aqueous alkali solution (e.g. $NH_4OH+H_2O_2+H_2O$), an aqueous acidic solution (e.g. $HCl+H_2O_2+H_2O$, $HF+H_2O_2+H_2O$), a neutral surfactant solution, an acidic surfactant solution, a basic surfactant solution, an aqueous surfactant solution, or a mixture of organic solvent and water, etc. Aqueous acidic solutions are beneficial for the removal of particulate contamination and trace metals from the surfaces of parts, components, tools, etc. Neutral, acidic, and base surfactant solutions can be used to adjust the surface chemistry on parts, components, tools, etc. to prevent the particles from re-depositing onto the surface of the parts, components, tools. Aqueous surfactant solutions can be used to wet hydrophobic surfaces such as Si, SiC, and graphite, and to enhance the micro-streaming of the megasonics. Organic solvent and water mixtures can also be used to increase the wettability of hydrophobic surfaces. However, it is important to note that the cleaning solution 209 used with embodiments of the present invention can be any suitable cleaning solution, fluid, etc. that is suitable for megasonic cleaning and that includes properties which enhance the micro-streaming process to facilitate the removal of particles as well as inhibiting the re-deposition of particles on the surfaces of processing component 208. In one embodiment of the present invention, the cleaning solution 209 can be heated to increase the particle removal efficiency. In another embodiment of the present invention, the cleaning solution 209 can be re-circulated using an in-situ filtration approach to increase the particle removal efficiency and to prevent the re-deposition of particles back to the surface(s) of the processing component 208. In yet another embodiment of the present invention, a selective sequence of cleaning chemistries 209 can be used to optimize the precision megasonic cleaning process. For example, a surfactant solution or organic solvent such as an IPA (isopropyl alcohol)/DIW (deionized water) mix can be used first, followed by an acidic or basic solution, depending on the chemical properties of the processing component 208 materials.

Referring still to FIG. 2A, according to one embodiment of the present invention, the apparatus 200 can include one or more megasonic transducers 210 coupled at the base 203 of the megasonic tank 202 and one or more megasonic transducers 204 coupled at the sidewalls 205 of the megasonic tank 202. Each of the megasonic transducers 210 can include a respective transducer element $210a$-$210d$ and a resonator element $210a'$-$210d'$. Likewise, each of the megasonic transducers 204 can include a respective transducer element $204a$-$204d$ and a resonator element $204a'$-$204d'$. The megasonic transducers 204, 210 can be any suitable commercially available etc. megasonic transducer. The apparatus 200 can further include a scanning megasonic plate assembly 214 that includes a megasonic transducer 206. The megasonic transducer 206 can include a transducer element $206a$ and a resonator element $206b$. As shown in FIG. 2A, according to one embodiment, the megasonic transducer 206 is immersed in the cleaning solution 209. However, in another embodiment, the tank 202 can provide a dry chamber (i.e. cleaning solution 209 is removed) and the megasonic transducer 206 can be configured above the processing component 208 and include high frequency megasonic energy-transfer liquid media flowing from the resonator element $206b$ onto exposed surfaces of the processing component 208. In one embodiment, the megasonic plate assembly 214 is capable of moving over the processing component 208 along a generally horizontal plane located proximal to an opening of the tank 202 using forward, backward, lateral, angular, or circular, etc. scanning motions to provide maximum megasonic energy exposure to surfaces of the processing component 208. In one embodiment, the megasonic plate assembly 214 can be coupled to a support structure located proximal to an opening of the tank 202. However, any other suitable means for supporting the megasonic plate assembly 214 so that the megasonic plate assembly 214 is capable of moving over the processing component 208 in any direction can be used. In one embodiment of the present invention, the one or more megasonic transducers 210, the one or more megasonic transducers 204, and the scanning megasonic plate assembly 214 can be optimally oriented or adjusted to collectively and simultaneously generate megasonic (acoustic) energy 215 in a plurality of directions, including directions perpendicular to surfaces of the processing component 208, to create a micro-streaming force within a static fluid boundary layer 216 that surrounds the processing component 208. In one embodiment of the present invention, the megasonic transducers 210 and the megasonic transducers 204 can be configured in an array (not shown) such that a single transducer and/or a zone of transducers within a corresponding array of transducers is powered on at different time intervals to maximize cleaning efficiency and to conserve power resources.

Figure 2B:
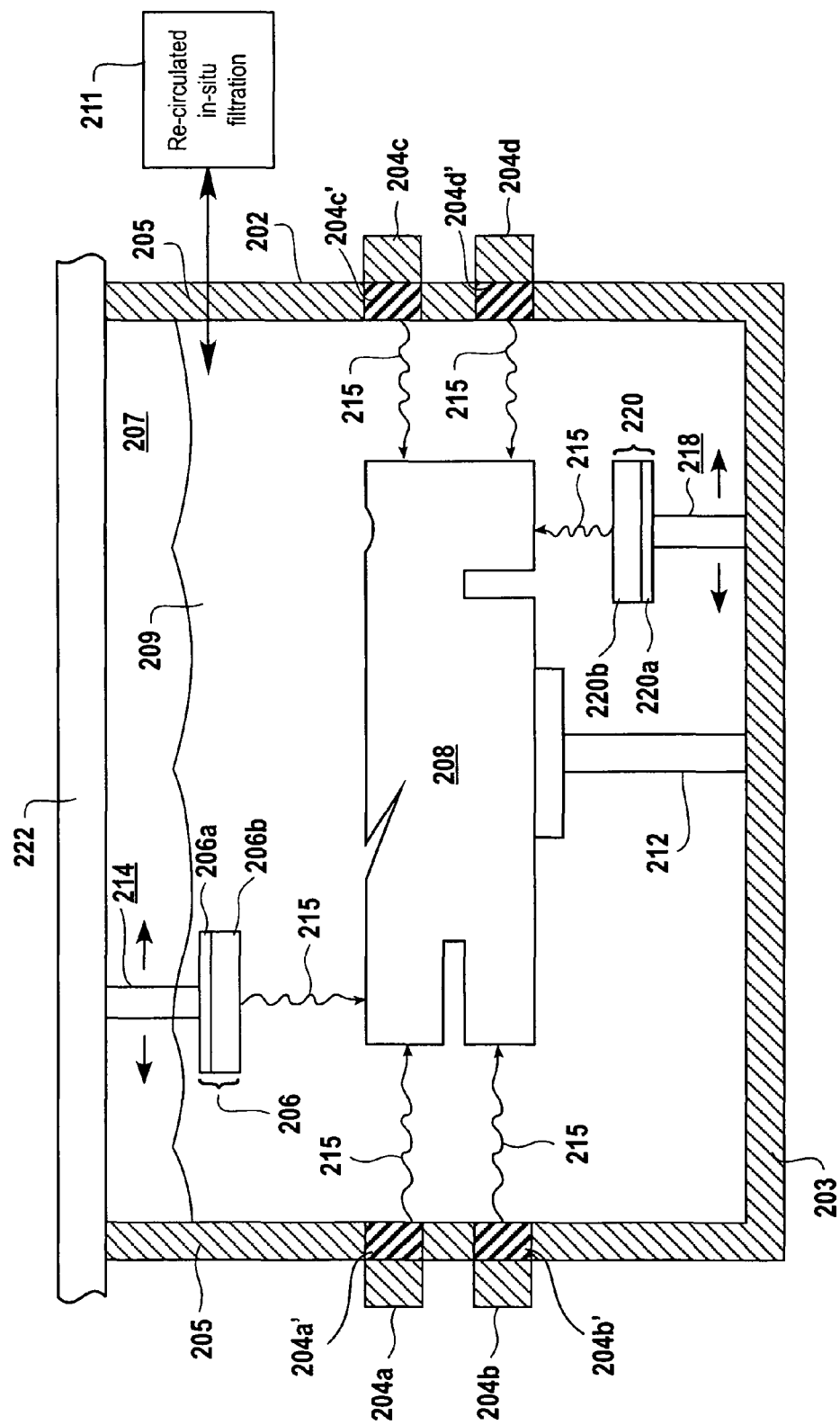
FIG. 2B is a cross-sectional view illustration of an alternative embodiment to the megasonic precision cleaning apparatus illustrated in FIG. 2A.

In FIG. 2B, is an alternative embodiment to the megasonic precision cleaning apparatus 200 illustrated in FIG. 2A. As shown in FIG. 2B, the megasonic transducers 210 shown in FIG. 2A can be replaced by a second scanning megasonic plate assembly 218 that is coupled at the base 203 of the tank 202 and within the cavity 207. Similar, to the scanning megasonic plate assembly 214 of FIG. 2A, the second scanning megasonic plate assembly 218 includes a megasonic transducer 220 that includes a transducer element 220a and a resonator element 220b. In one embodiment, the megasonic transducer 220 is configured such that the megasonic transducer 220 is immersed in the cleaning solution 209. The second scanning megasonic plate assembly 218 is capable of moving over the processing component 208 along a generally horizontal plane located proximal to the base 203 of the tank 202 using forward, backward, lateral, angular, or circular etc. scanning motions. In the FIG. 2B embodiment, the one or more horizontal transducers 204, and the scanning megasonic plate assemblies 214,218 can be optimally oriented or adjusted to collectively and simultaneously generate megasonic (acoustic) energy 215 in a plurality of directions, including directions perpendicular to surfaces of the processing component, to create a micro-streaming force within a static fluid boundary layer that surrounds the processing component 208. Similar to the megasonic transducer 206 of FIG. 2A, the corresponding megasonic transducers 206,220 shown in FIG. 2B are immersed in the cleaning solution 209. However, in one embodiment, the tank 202 can provide a dry chamber (i.e. cleaning solution 209 is removed) and the megasonic transducers 206,220 of FIG. 2B can be respectively configured above and below the processing component 208 and include high frequency megasonic energy-transfer liquid media flowing from the resonator elements 206b,220b onto exposed surfaces of the processing component 208.

Additionally, alternate embodiments to those discussed regarding FIGS. 2A and 2B can be provided. In one embodiment of the present invention, a scanning megasonic plate assembly (not shown) similar to the scanning megasonic plate assemblies 214,218 illustrated in FIGS. 2A and 2B can be coupled at the sidewalls 205 of the megasonic tank 202 to move along a generally vertical plane located proximal to a respective sidewall 205. In one embodiment of the present invention, a scanning megasonic plate assembly (not shown) similar to the scanning megasonic plate assemblies 214,218 illustrated in FIGS. 2A and 2B can be coupled to the tank 202 to move along the base 203, the sidewalls 205, and a closure (not shown) of the tank 202, where the scanning megasonic plate assembly can be capable of scanning substantially around all surface(s) of a processing component 208.

In another alternate embodiment to those discussed regarding FIGS. 2A and 2B, the carrier 212 shown in FIGS. 2A and 2B can be built as a motion assembly that rotates the processing component 208 in the tank cavity 207. In one embodiment, the rotating motion of the carrier 212 can be used in combination with the cleaning actions of one or a combination of the megasonic transducers 204,206,210 of FIG. 2A to clean surfaces of the processing component 208. In one embodiment, the rotating motion of the carrier 212 can be used in combination with the cleaning actions of one or a combination of the megasonic transducers 204,206,220 of FIG. 2B to clean surfaces of the processing component 208.

Figure 3A:
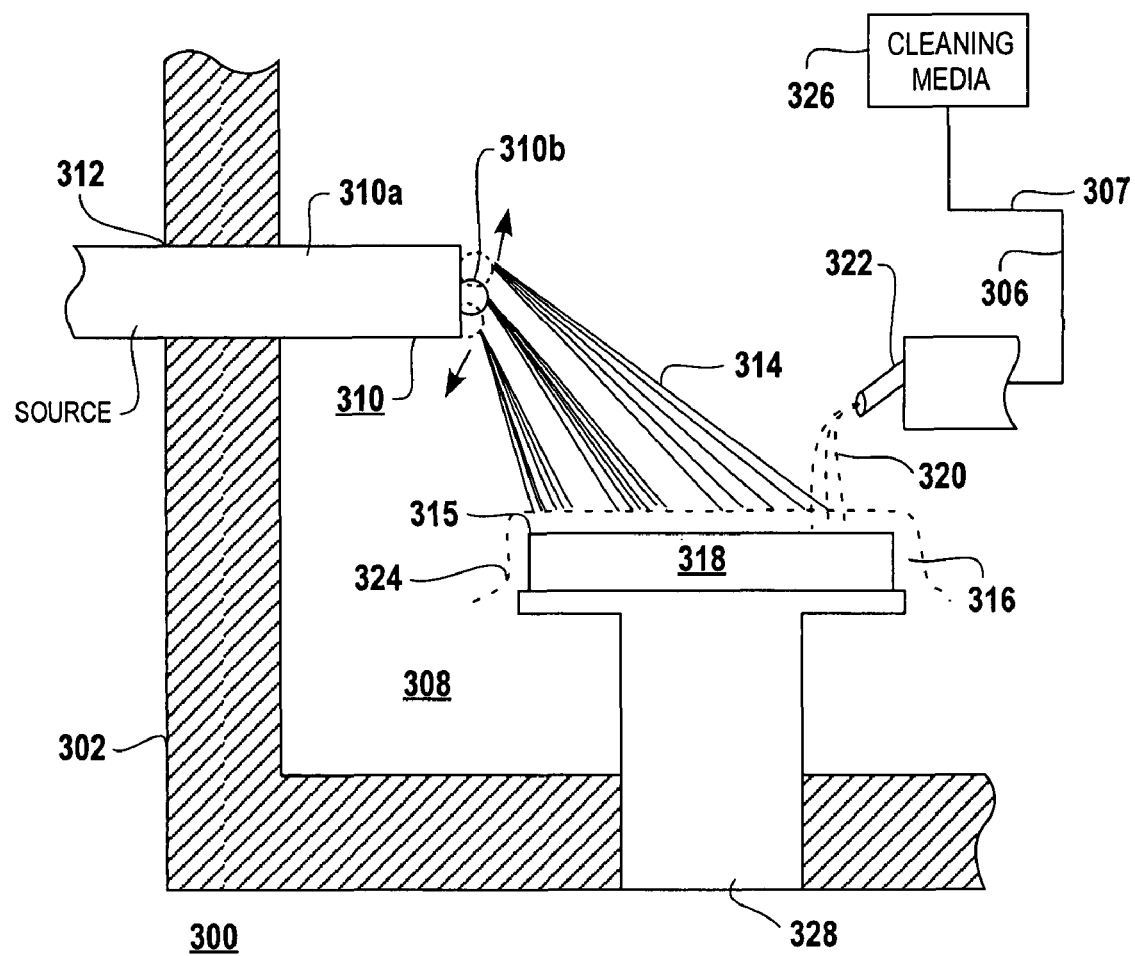
FIG. 3A is a cross-sectional view illustration of a megasonic precision cleaning apparatus including a sweeping megasonic beam in accordance with one embodiment of the present invention.

In FIG. 3A, is an illustration of a megasonic precision cleaning apparatus 300 including a sweeping megasonic beam assembly 310, in accordance with another embodiment of the present invention. The apparatus 300 further includes a processing chamber 302 that includes a carrier 328 or any other suitable means for supporting the processing component 318. In one embodiment of the present invention, the sweeping megasonic beam assembly 310 includes a megasonic transducer portion 310a and a head portion 310b. The sweeping megasonic beam assembly 310 can extend through an opening 312 of the processing chamber 302 into a cavity 308. Beams 314 of megasonic (acoustic) energy generated at the megasonic transducer portion 310a of the megasonic beam assembly 310 and radiated from the head portion 310b of the sweeping megasonic bean assembly 310 radiate and sweep across exposed surfaces 315, 316 of a processing component 318 while, at the same time, deionized water or a cleaning solution 320 provided from a cleaning source 326 of a fluid supply assembly 307 is sprayed onto exposed surfaces 315, 316 of the processing component 318 from a nozzle 322. The fluid supply assembly 307 can include a supply line 306 that couples the nozzle 322 to the cleaning source 326. A static fluid boundary 324 is created that surrounds the exposed surfaces 315, 316. of the processing component 318 through which megasonic energy from the beams 314 travels and interacts with the fluid 320 to create a micro-streaming force that continuously delivers fresh deionized water or a cleaning solution 320 to the exposed surfaces 315, 316. of the processing component 318 while simultaneously removing contaminants from the exposed surfaces 315, 316 etc. of the processing component 318.

Figure 3B:
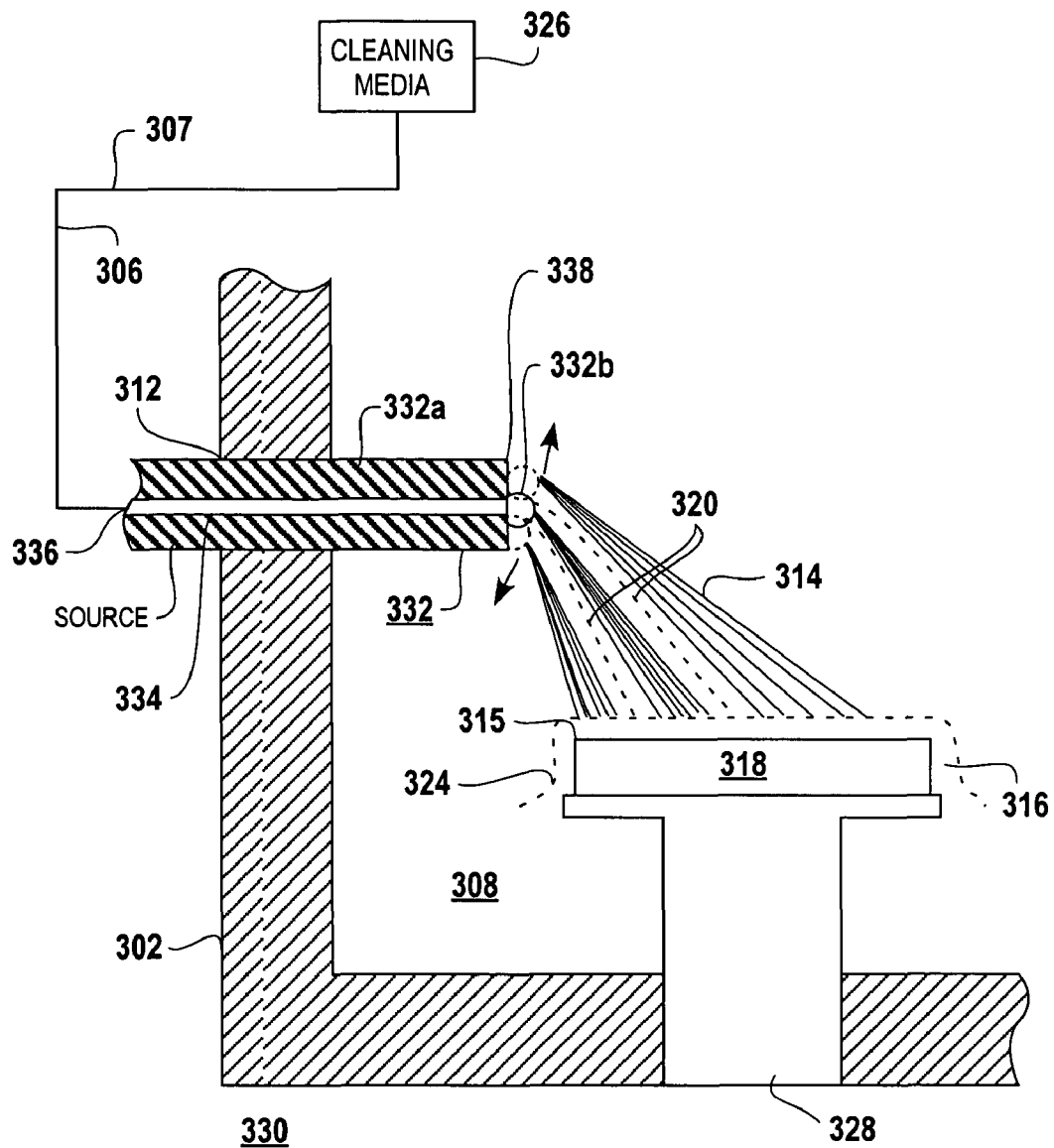
FIG. 3B is a cross-sectional view illustration of a megasonic precision cleaning apparatus including a sweeping megasonic beam in accordance with an alternate embodiment of the present invention.

In FIG. 3B, is an illustration of a megasonic precision cleaning apparatus 330 including a sweeping megasonic beam assembly 332, in accordance with another embodiment of the present invention. The apparatus 330 further includes a processing chamber 302 that includes a carrier 328 or any other suitable means for supporting the processing component 318. In one embodiment of the present invention, the sweeping megasonic beam assembly 332 includes a megasonic transducer portion 332a and a head portion 332b. The sweeping megasonic beam assembly 332 can extend through an opening 312 of the processing chamber 302 into a cavity 308. In one embodiment, the megasonic transducer portion 332a includes a throughway 334 having an inlet 336 and an outlet 338, where deionized water or cleaning solution 320 etc. originating from a cleaning media source 326 enters the megasonic beam assembly 332 from a supply line 306 at the inlet 336 of the megasonic transducer portion 332a. The deionized water or cleaning solution 320 travels along the throughway 334, exits the throughway 334 at the outlet 338, and enters the head portion 332b. At the head portion 332b, beams 314 of megasonic (acoustic) energy generated at the megasonic transducer portion 332a of the megasonic beam assembly 332 and radiated from the head portion 332b of the sweeping megasonic bean assembly 332 radiate and sweep across exposed surfaces 315, 316 of a processing component 318 while, at the same time, acoustically energized deionized water or a cleaning solution 320 provided from a cleaning source 326 is sprayed onto exposed surfaces 315, 316 of the processing component 318 from the head portion 332b. A static fluid boundary 324 is created that surrounds the exposed surfaces 315, 316 etc. of the processing component 318 through which megasonic energy from the beams 314 travels and interacts with the fluid 320 to create a microstreaming force that continuously delivers fresh deionized water or a cleaning solution 320 to the exposed surfaces 315, 316 etc. of the processing component 318 while simultaneously removing contaminants from the exposed surfaces 315, 316 of the processing component 318. In one embodiment, as discussed in more detail below, the carrier 328 is capable of rotating the processing component 318 such that all surfaces of the processing component 318 are exposed to the megasonic energy emitted from the beams 314 and the deionized water or cleaning solution 320. In one embodiment, the cleaning solution 320 is applied first, followed by the deionized water while the megasonic power is on.

Referring to FIGS. 3A and 3B, to maximize the precision cleaning of the processing component 318, in one embodiment of the present invention, the processing component 318 can be manually or mechanically flipped, or rotated on or by the carrier 328 to facilitate the removal of contaminants from all surfaces of the processing component 318. Additionally, in one embodiment of the present invention, the head portion 310b,332b of the sweeping megasonic beam assembly 310, 332 can be capable of using forward, backward, lateral, angular, or circular etc. sweeping motions to provide maximum exposure of megasonic energy to surfaces of the processing component 318.

Moreover, as mentioned above in FIG. 2, the cleaning solution 320 of FIGS. 3A and 3B can include an aqueous alkali solution (e.g. $NH_4OH+H_2O_2+H_2O$), an aqueous acidic solution (e.g. $HCl+H_2O_2+H_2O$, $HF+H_2O_2+H_2O$), a neutral surfactant solution, an acidic surfactant solution, a basic surfactant solution, an aqueous surfactant solution, or a mixture of organic solvent and water, etc. Again, it is important to note, however, that the cleaning solution can be any suitable cleaning solution, fluid, etc. 320 that can be used for megasonic cleaning. The cleaning solution 320 can include properties that enhance the micro-streaming process to facilitate the removal of particles as well as inhibit the re-deposition of particles on the surfaces of the part, tool, component, etc. 318. In one embodiment of the present invention, the cleaning solution or the deionized water 320 can be heated to increase the particle removal efficiency. Likewise, the deionized water or cleaning solution 320 can be re-circulated using an in-situ filtration approach to increase the particle removal efficiency and to prevent the re-deposition of particles back to the surface(s) 315, 316 of the processing component 318. And, in yet another embodiment of the present invention, a selective sequence of cleaning chemistries 320 like those discussed above in FIG. 2 can be used to optimize the precision megasonic cleaning process of FIG. 3.

Figure 4:
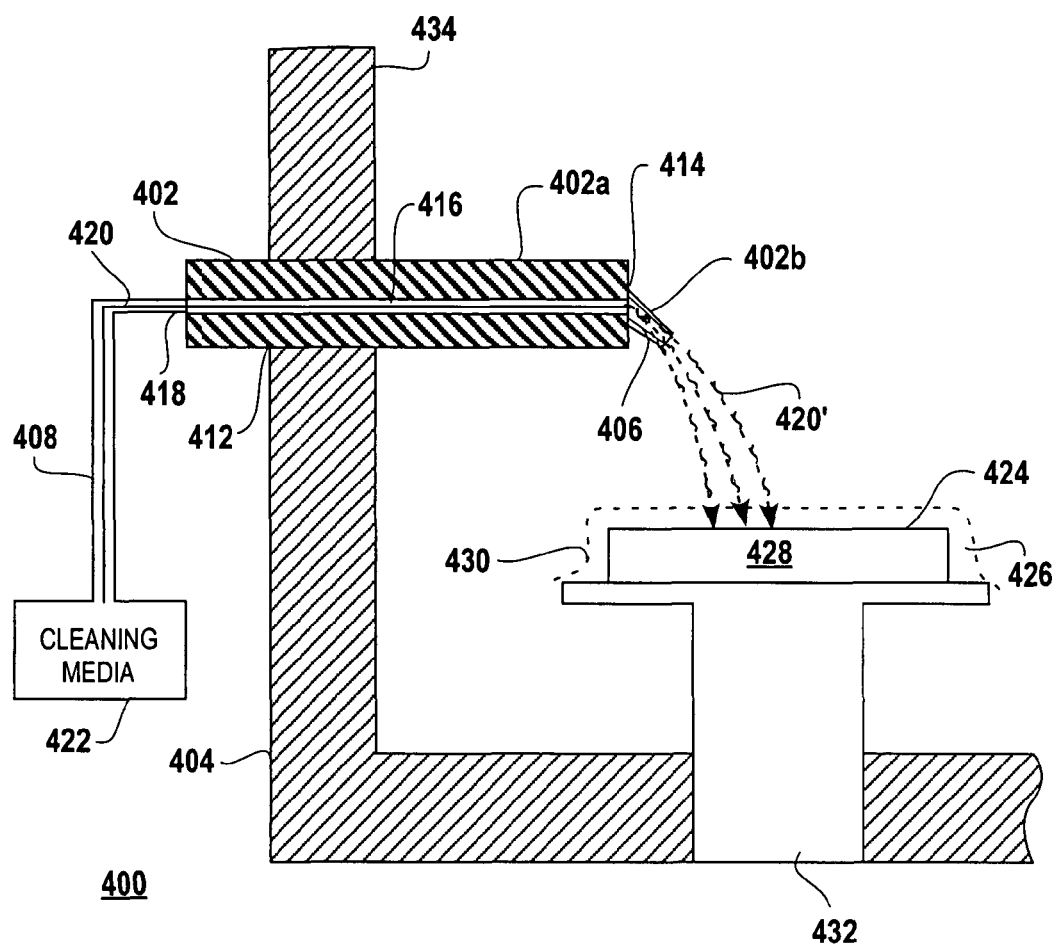
FIG. 4 is a cross-sectional view illustration of a megasonic precision cleaning apparatus including a megasonic jet in accordance with one embodiment of the present invention.

In FIG. 4, is an illustration of a megasonic precision cleaning apparatus 400 including a megasonic jet assembly 402, in accordance with another embodiment of the present invention. The apparatus 400 includes a processing chamber 404 that includes a carrier 432, or any other suitable means for supporting the processing component 428. In one embodiment, the megasonic jet assembly 402 can extend through an opening 412 of the processing chamber 404 as shown in FIG. 4, or the megasonic jet assembly 402 can be configured directly above an edge 434 of the processing chamber 404. In one embodiment, the megasonic jet assembly 402 includes a body portion 402a and a megasonic transducer nozzle portion 402b coupled at an outlet 414 of the body portion 402a. The body portion 402a includes a throughway 416 having an inlet 418 and the outlet 414, where deionized water or cleaning solution etc. 420 originating from a cleaning media source 422 enters the megasonic jet assembly 402 from a supply line 408 at the inlet 418 of the body portion 402a. The deionized water or cleaning solution 420 travels along the throughway 416, exits the throughway 416 at the outlet 414, and enters the megasonic transducer portion nozzle 402b. The megasonic transducer nozzle portion 402b is capable of generating acoustic energy so that as the deionized water or cleaning solution etc. 420 passes through a throughway 406 of the megasonic transducer nozzle portion 402b, the fluid 420 is acoustically energized and sprayed onto exposed surfaces 424, 426 of a processing component 428 from the megasonic transducer nozzle portion 402b. By spraying the acoustically energized fluid 420' onto exposed surfaces 424,426 of the processing component 428 from the megasonic transducer nozzle portion 402b, a micro-streaming force within a static fluid boundary layer 430 that surrounds the exposed surfaces 424, 426 of the processing component 428 continuously delivers fresh solution to the surface(s) 424, 426 of the processing component 428 while simultaneously removing particulate contamination and depleting old chemistry from the surface(s) 424, 428 of the processing component 428. As discussed herein with respect to other embodiments of the present invention, the cleaning solution 420 can be any suitable solution etc. that can be used for megasonic cleaning and that includes properties that enhance the micro-streaming process to facilitate the removal of particles as well as inhibiting the re-deposition of particles on the surfaces of a part, tool, component, etc. Moreover, the fluid 420 can be heated, re-circulated, and sequenced as discussed in FIGS. 2-3.

Referring still to FIG. 4, to optimize the cleaning efficiency of surface(s) 424, 426 of the processing component 428, the megasonic transducer nozzle portion 402b can be a rotating nozzle that is capable of spraying the acoustically energized fluid 420' using forward, backward, lateral, angular, or circular etc. scanning or sweeping motions to further optimize the cleaning efficiency of the surfaces 424, 426 of the processing component 428, according to one embodiment of the present invention. In another embodiment, the processing component 428 can be manually or mechanically flipped or rotated on or by the carrier 432 to facilitate the removal of contaminants from previously unexposed surfaces etc. of the processing component 428 using the precision cleaning approach described immediately above.

Figure 5:
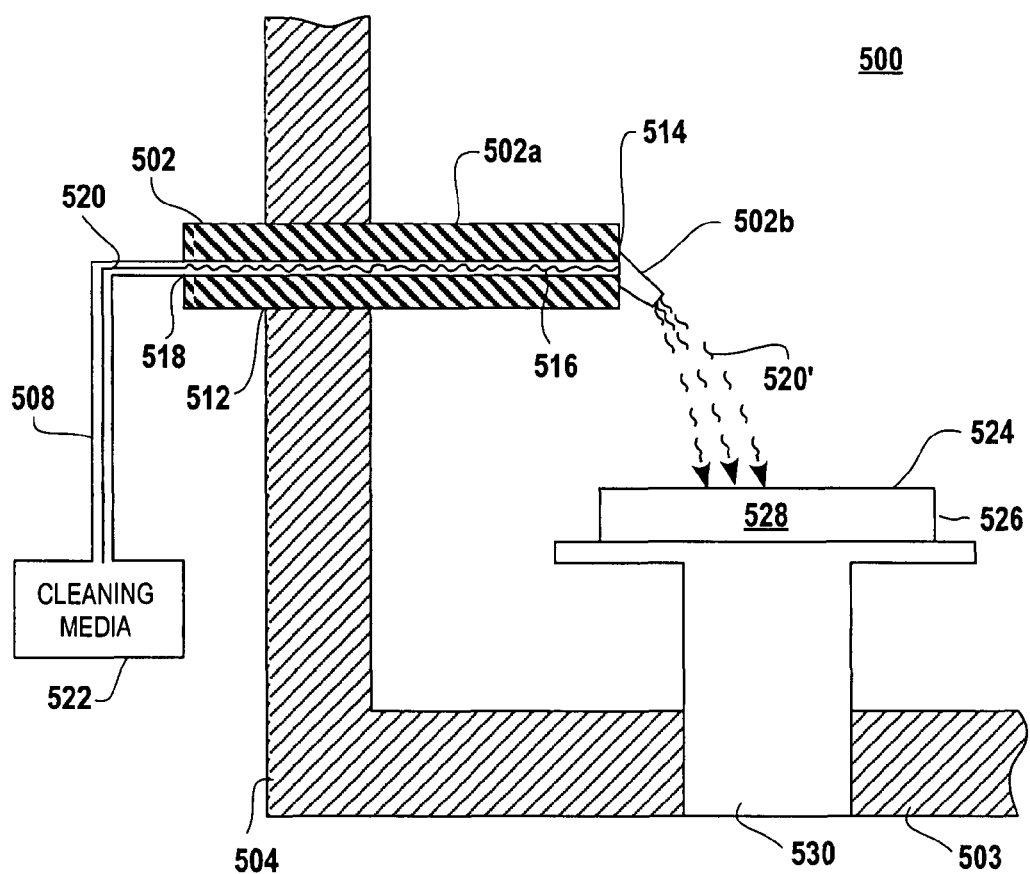
FIG. 5 is a cross-sectional view illustration of a megasonic precision cleaning apparatus including an alternative megasonic jet in accordance with one embodiment of the present invention.

In FIG. 5, is an illustration of a megasonic precision cleaning apparatus 500 including an alternative megasonic jet assembly 502, in accordance with another embodiment of the present invention. The apparatus 500 includes a processing chamber 504 that includes a carrier 530 or any other suitable means for supporting at processing component 528. In one embodiment, the megasonic jet assembly 502 can extend through an opening 512 of the processing chamber 504 as shown in FIG. 5, or the megasonic jet assembly 502 can configured at an opening of the processing chamber 504 opposite the base 503. In the FIG. 5 embodiment, the megasonic jet assembly 502 includes a megasonic transducer body portion 502a and a nozzle portion 502b that is coupled at an outlet 514 of the megasonic transducer body portion 502a. The megasonic transducer body portion 502a includes a throughway 516 having an inlet 518 and the outlet 514, where the megasonic transducer body portion 502a is capable of generating acoustic energy and propagating the acoustic energy into the throughway 516 so that as deionized water or a cleaning solution etc. 520 originating from a cleaning media source 522 via a supply line 508 enters the megasonic jet assembly 502 at the inlet 518 of the megasonic transducer body portion 502a, the fluid 520 is acoustically energized as it travels along the throughway 516 and the acoustically energized fluid 520' is sprayed onto exposed surfaces 524, 526 of a processing component 528 from the nozzle portion 502b.

Referring still to FIG. 5, to optimize the cleaning efficiency of surface(s) 524, 526 of the processing component 528, the nozzle portion 502b can be a rotating nozzle that is capable of spraying the acoustically energized fluid 420' using forward, backward, lateral, angular, or circular etc. scanning or sweeping motions to further optimize the cleaning efficiency of the surfaces 524, 526 of the processing component 528, according to one embodiment of the present invention. In another embodiment, the processing component 528 can be manually or mechanically flipped or rotated on or by the carrier 530 to facilitate the removal of contaminants from previously unexposed surfaces etc. of the processing component 528 using the precision cleaning approach described immediately above.

In view of the discussion above, an advantage of the megasonic cleaning apparatus and methods of embodiments of the present invention is to provide precision cleaning of tools, components, parts etc. used in semiconductor, medical, or any other processing environment to remove sub-micron particulate contamination from the surfaces of the tools, components, parts etc. This is an advantage over conventional systems where, for example, the low frequency ultrasonic energy used to clean processing equipment is ineffective at removing sub-micron particulate contamination. According to embodiments of the present invention, different megasonic apparatus can be used to clean components having varied configurations, sizes, and critical surface geometry. For example, when a tool, component, or part etc. is perforated with deep (e.g. greater than 10 mm) holes of small diameter (e.g. less than 1 mm), sub-micron particles trapped inside these deep holes, like the gas holes on the Si electrode used in the plasma dry etchers etc., which otherwise would be extremely difficult to remove can be effectively removed using embodiments of the present invention. Moreover, different chemistries can be used to enhance the megasonic precision cleaning of tools, components, parts, etc. and, depending upon the chemical and physical properties of the part being cleaned different chemistries or solutions can be used to enhance the performance of the megasonic precision cleaning apparatus. Additionally, the sequence of application of chemistries can also be used to optimize the megasonic precision cleaning process of tools, components, parts, etc. In other words, the cleaning mechanisms utilized in embodiments of the present invention combine micro-streaming forces created from megasonic energy with chemical actions so that precision megasonic cleaning efficiency can be determined by the micro-streaming forces which produce pumping actions and deliver fresh chemistry to a surface of tools, components, parts, etc. to be cleaned, and rinsed; the chemical action between contaminants where the surface-zeta potential of the surface to be cleaned can be adjusted by the addition of chemicals to create a repelling force between the surface to be cleaned and the particulate or thin-film contaminants; and the mechanical removal of loose particles from the surface to be cleaned. Also, according to embodiments of the present invention, acidic or basic cleaning solutions in combination with the application of megasonic energy can be used to remove metallic contamination from the surfaces of processing components more easily.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for cleaning a processing component, comprising:
   a tank having a cavity defined by a base and one or more sidewalls extending therefrom, an opening opposite the base, and a closure coupled to the opening, the tank being configured to hold a volume of fluid within the cavity to immerse the processing component;
   a plate assembly is coupled to a support structure that is located proximal to the opening of the tank and extends into the volume of fluid within the cavity, wherein the plate assembly is configured to move in a scanning motion along a horizontal plane located proximal to the opening and inside the closure of the tank, such that the plate assembly is movable over a surface of the processing component when present in the cavity of the tank, and wherein the plate assembly itself includes a transducer element and a resonator element, such that high frequency megasonic acoustic energy is generated by the plate assembly that is adjustable to a plurality of directions, certain ones of the plurality of directions of the plate assembly having orientation settings to a direction generally perpendicular to the surface of the processing component, for a surface location and surface configuration of the processing component;
   a carrier element, wherein the carrier element is defined to support the processing component within the cavity of the tank, the carrier element having a mechanism for flipping the processing component during cleaning;
   wherein the processing component is a semiconductor device processing component and is not a semiconductor wafer.

2. An apparatus as recited in claim 1, further comprising one or more megasonic transducers coupled to at least one of the one or more sidewalls, wherein the one or more megasonic transducers coupled to at least one of the one more sidewalls generate megasonic energy associated with a direction generally perpendicular to a second surface of the processing component.

3. An apparatus as recited in claim 1, further comprising one or more megasonic transducers coupled to the base, wherein the one or more megasonic transducers coupled to the base generates megasonic energy associated with a direction generally perpendicular to a third surface of the processing component.

4. An apparatus as recited in claim 1, further comprising a second plate assembly, where the second plate assembly is coupled to the base of the tank, the second plate assembly is movable over a second surface of the processing component that is generally opposite the surface of the processing component, and the second plate assembly generates acoustic energy associated with a direction generally perpendicular to the second surface of the processing component.

5. An apparatus as recited in claim 1, wherein moving over the surface of the processing component includes a forward, a backward, a lateral, an angular, or a circular scanning motion.

6. An apparatus as recited in claim 1, wherein the fluid is deionized water.

7. An apparatus as recited in claim 1, wherein the fluid is an aqueous alkali solution, an aqueous acidic solution, a neutral surfactant solution, an acidic surfactant solution, a basic surfactant solution, an aqueous surfactant solution, or a mixture of organic solvent and water.

8. An apparatus as recited in claim 7, wherein the aqueous alkali solution is $NH_4OH+H_2O_2+H_2O$.

9. An apparatus as recited in claim 7, wherein the aqueous acidic solution is $HCl+H_2O_2+H_2O$, $HF+H_2O_2+H_2O$.

10. An apparatus as recited in claim 1, wherein the fluid is heated.

11. An apparatus as recited in claim 1, wherein the fluid is re-circulated using in-situ filtration.

12. An apparatus as recited in claim 1, wherein the fluid is one of a sequence of fluids, the sequence of fluids being selectively added within the cavity of the tank to optimize cleaning of the surface.

13. An apparatus as recited in claim 1, wherein the high frequency megasonic acoustic energy is energy having a frequency of 600 KHz to 2 MHz.

14. An apparatus for cleaning a processing tool part used in the processing of semiconductor wafers, comprising:

a tank having a cavity defined by a base and one or more sidewalls extending therefrom, an opening opposite the base, and a closure coupled to the opening, the tank being configured to hold a volume of fluid within the cavity to immerse the processing tool part;

inside the cavity, the sidewalls including one or more megasonic transducers;

a plate assembly is coupled to a support structure that is located proximal to the opening of the tank and extends into the cavity, wherein the plate assembly is movable along a horizontal plane located proximal to the opening and inside the closure of the tank, such that the plate assembly is movable over a surface of the processing tool part when present in the cavity of the tank, and wherein the plate assembly itself includes a transducer element and a resonator element, such that high frequency megasonic acoustic energy is generated by the plate assembly that is adjustable to a plurality of directions, certain ones of the plurality of directions of the plate assembly having orientation settings to a direction generally perpendicular to the surface of the processing component, for a surface location and surface configuration of the processing component; and a carrier element, wherein the carrier element supports the processing tool part within the cavity of the tank, the carrier element having a mechanism for flipping the processing component during cleaning, the processing tool part not being a semiconductor wafer.

15. An apparatus for cleaning a processing tool part used in the processing of semiconductor wafers, comprising:

a tank having a cavity defined by a base and one or more sidewalls extending therefrom, an opening opposite the base, and a closure coupled to the opening, the tank being configured to hold a volume of fluid within the cavity to immerse the processing tool part;

inside the cavity, the sidewalls including one or more megasonic transducers;

a top plate assembly is coupled to a support structure that is located proximal to the opening of the tank and extends into the cavity, wherein the top plate assembly is movable along a horizontal plane located proximal to the opening and inside the closure of the tank, such that the top plate assembly is movable over a surface of the processing tool part when present in the cavity of the tank, and wherein the top plate assembly itself includes a transducer element and a resonator element, such that high frequency megasonic acoustic energy is generated by the top plate assembly that is adjustable to a plurality of directions, certain ones of the plurality of directions of the plate assembly having orientation settings to a direction generally perpendicular to the surface of the processing tool part, for a surface location and surface configuration of the processing tool part;

a bottom plate assembly coupled to the base of the tank, the bottom plate assembly is movable along a horizontal plane located proximal to the base of the tank, such that the bottom plate assembly is movable under a surface of the processing tool part when present in the cavity of the tank, wherein the bottom plate assembly itself includes a transducer element and a resonator element, such that high frequency megasonic acoustic energy is generated by the bottom plate assembly and is associated with a direction generally perpendicular to the surface of the processing tool part; and a carrier element, wherein the carrier element provides support for the processing tool part within the cavity of the tank, the carrier element having a mechanism for flipping the processing tool part during cleaning, and the processing tool part is not a semiconductor wafer.

* * * * *